(12) United States Patent
Fujiki

(10) Patent No.: US 12,706,259 B2
(45) Date of Patent: Aug. 11, 2026

(54) INPUT APPARATUS AND INPUT DETERMINATION METHOD

(71) Applicant: Alps Alpine Co., Ltd., Tokyo (JP)

(72) Inventor: Takashi Fujiki, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 321 days.

(21) Appl. No.: 18/395,933

(22) Filed: Dec. 26, 2023

(65) Prior Publication Data

US 2024/0128035 A1 Apr. 18, 2024

Related U.S. Application Data

(63) Continuation of application No. PCT/JP2022/009533, filed on Mar. 4, 2022.

(30) Foreign Application Priority Data

Aug. 17, 2021 (JP) ................................ 2021-132669

(51) Int. Cl.
*H01H 13/14* (2006.01)
*H03K 17/96* (2006.01)

(52) U.S. Cl.
CPC ........... *H01H 13/14* (2013.01); *H03K 17/962* (2013.01); *H01H 2239/006* (2013.01); *H01H 2239/074* (2013.01)

(58) Field of Classification Search
None
See application file for complete search history.

(56) References Cited

U.S. PATENT DOCUMENTS

2016/0364001 A1 12/2016 Hirose et al.
2019/0050073 A1 2/2019 Murakami
2019/0107447 A1* 4/2019 Ebisui .................. H01H 13/48
(Continued)

FOREIGN PATENT DOCUMENTS

JP 2016-163854 A 9/2016
WO 2012-176748 A1 12/2012
(Continued)

OTHER PUBLICATIONS

International Search Report issued in the corresponding International Application No. PCT/JP2021/013286; mailed on Jun. 1, 2021 (total 3 pages).

*Primary Examiner* — Krishna P Neupane
(74) *Attorney, Agent, or Firm* — Harness, Dickey & Pierce, P.L.C.

(57) ABSTRACT

An input apparatus includes an operating portion configured to be subjected to a pressing operation by an operator, an operation detection sensor whose output value is varied by the pressing operation on the operating portion, a processor configured to determine whether the pressing operation has been performed based on the output value of the operation detection sensor, and a feel generator configured to generate an operation feel in a pressing direction to the operator in response to the pressing operation on the operating portion, wherein, in response to the operation detection sensor outputting an output value corresponding to feel characteristics representing the characteristics of the pressing force, generated by the feel generator, with respect to an elapsed time during the pressing operation, the processor determines that the pressing operation has been completed.

10 Claims, 9 Drawing Sheets

(56) References Cited

U.S. PATENT DOCUMENTS

| | | | | |
|---|---|---|---|---|
| 2020/0004288 | A1* | 1/2020 | Yano | G05G 1/02 |
| 2020/0125174 | A1 | 4/2020 | Oikawa et al. | |
| 2021/0342006 | A1 | 11/2021 | Nakamura | |

FOREIGN PATENT DOCUMENTS

| | | | |
|---|---|---|---|
| WO | 2015-136923 | A1 | 9/2015 |
| WO | 2017-145745 | A1 | 8/2017 |
| WO | 2018-123661 | A1 | 7/2018 |
| WO | 2018-139217 | A1 | 8/2018 |
| WO | 2020-071412 | A1 | 4/2020 |

* cited by examiner

INPUT APPARATUS AND INPUT DETERMINATION METHOD

CLAIM OF PRIORITY

This application is a Continuation of International Application No. PCT/JP2022/009533 filed on Mar. 4, 2022, which claims benefit of Japanese Patent Application No. 2021-132669 filed on Aug. 17, 2021. The entire contents of each application noted above are hereby incorporated by reference.

BACKGROUND OF THE INVENTION

1. Field of the Invention

The present invention relates to an input apparatus and an input determination method.

2. Description of the Related Art

An input apparatus known in the related art includes an input section including electrodes and a pressure sensitive layer, the electrodes being opposed so as to be electrically interconnected, one of which is an operation target, the pressure sensitive layer being disposed between the opposing electrodes and varying in electrical resistance according to a pressure on the operation target electrode applied by an electrically conductive input means. The input apparatus calculates the operating state, the operation position, and the operation pressure of the input means by detecting variations in the amount of capacitance and the pressure in the input section (for example, see International Publication No. WO2012/176748).

The capacitance between the opposing electrodes varies significantly under the influence of noise. The capacitance between the opposing electrodes may also vary because of an operation different from the operation to be detected. For this reason, determination of whether an operation has been performed only from an increase in the capacitance between the opposing electrodes can result in erroneous determination.

SUMMARY OF THE INVENTION

The present invention provides an input apparatus configured such that erroneous determination can be reduced or eliminated also in a situation in which the capacitance varies because of, for example, noise or an operation different from the operation to be detected, and an input determination method for the same.

An input apparatus according to an embodiment of the present invention includes an operating portion configured to be subjected to a pressing operation by an operator, an operation detection sensor whose output value is varied by the pressing operation on the operating portion, a processor configured to determine whether the pressing operation has been performed based on the output value of the operation detection sensor, and a feel generator configured to generate an operation feel in a pressing direction to the operator in response to the pressing operation on the operating portion, wherein, in response to the operation detection sensor outputting an output value corresponding to feel characteristics representing the characteristics of the pressing force, generated by the feel generator, with respect to an elapsed time during the pressing operation, the processor determines that the pressing operation has been completed.

DESCRIPTION OF THE PREFERRED EMBODIMENTS

An input apparatus and an input determination method according to an embodiment of the present invention will be described hereinbelow.

Embodiment

Figure 1A:
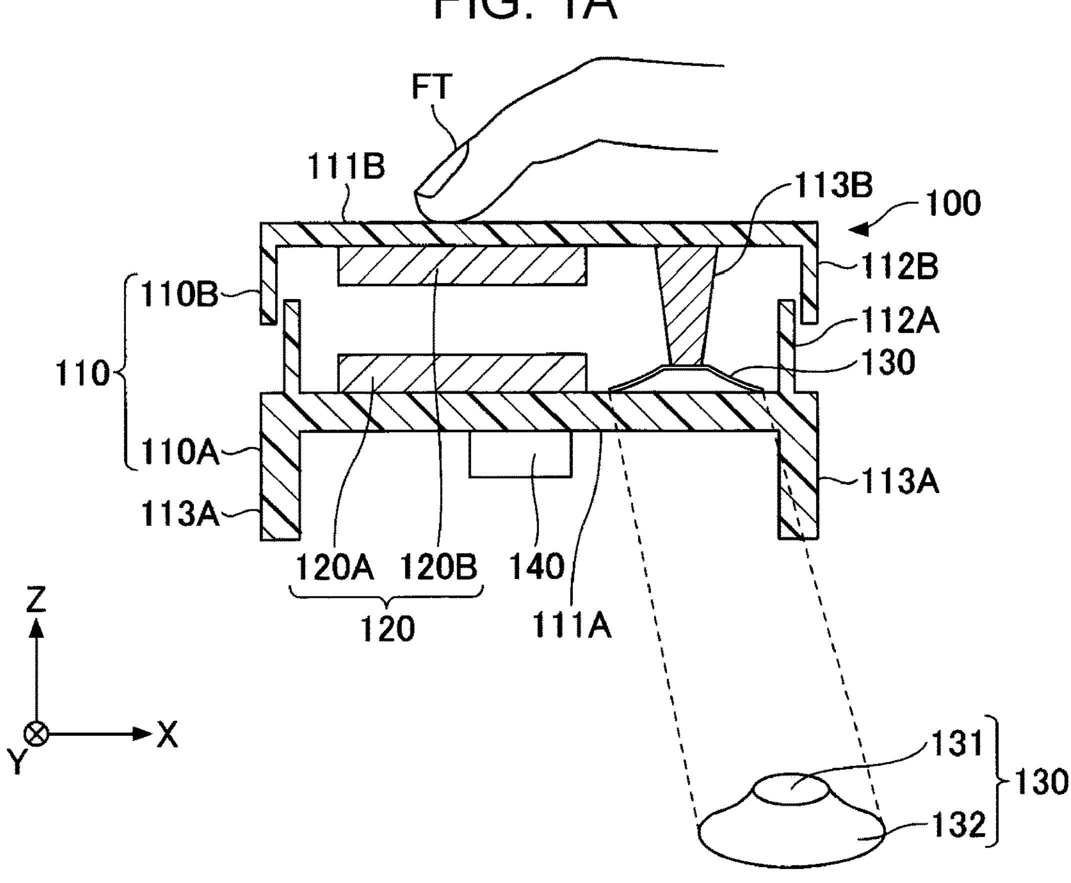
FIG. 1A is a cross-sectional view of an input apparatus according to an embodiment, illustrating an example of the configuration and operation thereof.
Figure 1B:
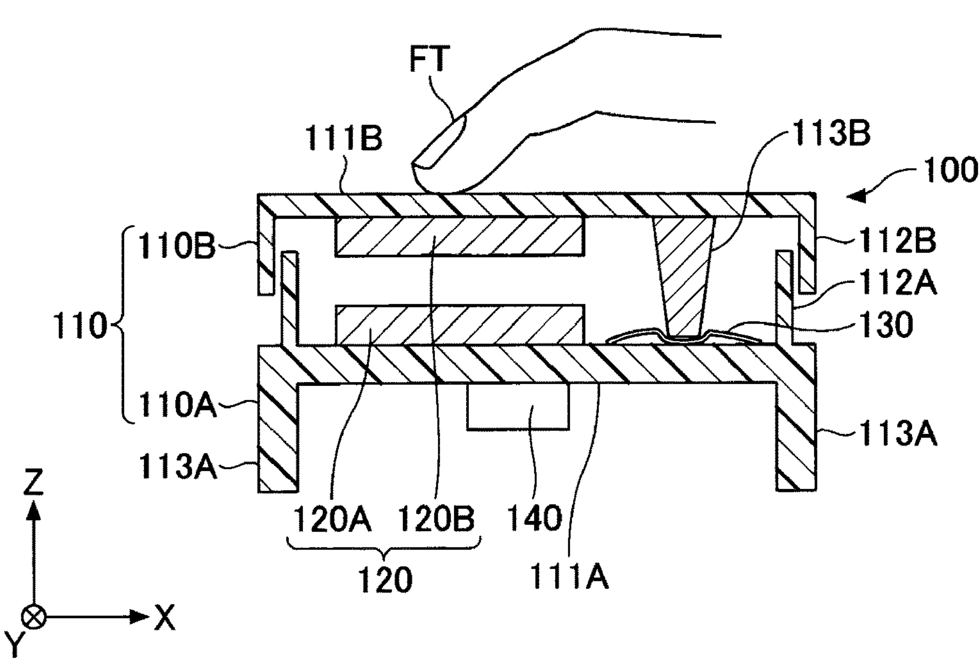
FIG. 1B is a cross-sectional view of the input apparatus according to an embodiment, illustrating an example of the configuration and operation thereof.

FIGS. 1A and 1B are cross-sectional views of an input apparatus 100 according to an embodiment, illustrating configuration and operation examples. The following description is made based on the XYZ coordinate system. The −Z direction side is referred to as the downside or downward, and the +Z direction side is referred to as the upperside or upward. The plan view refers to an XY plan view. The vertical relationship is not universal.

FIG. 1A illustrates a state in which a fingertip FT is giving a touch (touch only). In the state illustrated in FIG. 1A, the fingertip FT is merely touching the upper surface of the input apparatus 100 and does not press it downward. Accordingly, the state illustrated in FIG. 1A is an initial state before pressure. FIG. 1B illustrates a state in which the fingertip FT is giving a touch and a pressure (touch & pressure). In the state illustrated in FIG. 1B, the input apparatus 100 is pressed downward as compared with the state illustrated in FIG. 1A.

Configuration and Operation of Input Apparatus 100

The input apparatus 100 includes a casing 110, an electrostatic sensor 120, a metal contact 130, and a processor 140. The electrostatic sensor 120 is an example of an operation detection sensor. The metal contact 130 is an example of a feel generator.

The input apparatus 100 can be pressed by an operator using a part of the body (living body), such as a hand. The pressing operation can be completed when the output value of the electrostatic sensor 120 satisfies a predetermined condition. Completing the pressing operation refers to finalizing the selected operation content, for example, through an operator's pressing operation.

When determining whether the pressing operation has been completed, the input apparatus 100 uses the output value of the electrostatic sensor 120, not the output of the metal contact 130. The metal contact 130 is used to provide a feel (tactile impression) to the operator, and the electrical connection status of the metal contact 130 is not used to determine whether the pressing operation has been completed. Here, an embodiment in which the operator performs a pressing operation on the input apparatus 100 with the fingertip FT will be described by way of example.

In one example, the input apparatus 100 uses the electrostatic sensor 120 as an example of an operation detection sensor for use in accepting the pressing operation. Other examples of the operation detection sensor include an inductive sensor (an inductive proximity sensor), an optical sensor, an infrared sensor, a pressure sensor, a strain sensor, and a magnetic sensor.

The casing 110 is used to house or hold the electrostatic sensor 120, the metal contact 130, and the processor 140. When the electrostatic sensor 120 is used as a detection sensor, the casing 110 may be made of a dielectric material, such as resin. This is to allow detection of the approach of the fingertip FT with the electrostatic sensor 120. Examples of the casing 110 include the cases or part of the cases of a smartphone, a tablet computer, a game machine, the interior or exterior of a vehicle, and other input apparatuses.

The casing 110 includes a fixed portion 110A and an operating portion 110B. The fixed portion 110A is fixed to a site at which the input apparatus 100 is disposed. The fixed portion 110A includes a base 111A, a guide 112A, and a leg 113A.

The base 111A is a plate-like portion serving as the base of the fixed portion 110A. On the upper surface of the base 111A, a guide 112A is integrally provided and an electrode 120A of the electrostatic sensor 120 is disposed.

The guide 112A is a wall extending upward from the upper surface of the base 111A and guides and holds the operating portion 110B so as to be movable in the vertical direction with respect to the fixed portion 110A. The guide 112A may have a groove or the like having a shape corresponding to an engaging portion 112B of the operating portion 110B and extending in the vertical direction. The leg 113A is used to fix the fixed portion 110A to the site in which the input apparatus 100 is disposed.

The operating portion 110B may include a covering portion 111B, an engaging portion 112B, and a pressing portion 113B and can be moved (movable) with respect to the fixed portion 110A. To be movable is to be displaceable. In this embodiment, the fingertip FT is brought into direct-contact with (touches) the upper surface of the covering portion 111B of the operating portion 110B. Alternatively, a member covering the upper surface of the covering portion 111B may be provided, in which case the fingertip FT touches the upper surface of the member covering the upper surface of the covering portion 111B.

The covering portion 111B serves as the base of the operating portion 110B and has an upper surface to be touched and pressed by the fingertip FT. On the lower surface of the covering portion 111B, an electrode 120B of the electrostatic sensor 120 is provided.

Here, the pressing operation refers to an operation to press the upper surface of the covering portion 111B downward. Specifically, an operation to press the operating portion 110B downward as illustrated in FIG. 1B from the state illustrated in FIG. 1A is the pressing operation. The pressing operation on the covering portion 111B is synonymous with the pressing operation on the input apparatus 100.

The engaging portion 112B is a wall extending downward from the lower surface of the covering portion 111B and is guided by the guide 112A by sliding with respect to the guide 112A. The engaging portion 112B may be integral to the covering portion 111B or may be a separate member from the covering portion 111B and may be attached to the covering portion 111B. The engaging portion 112B is provided to position the operating portion 110B with respect to the fixed portion 110A and to allow the operating portion 110B to move in the vertical direction with respect to the fixed portion 110A.

The pressing portion 113B is a rod-like member extending from the lower surface of the covering portion 111B downward. The pressing portion 113B may be integral to the covering portion 111B or may be a separate member from the covering portion 111B and may be attached to the covering portion 111B. In one example, the covering portion 111B is a separate member from the pressing portion 113B and is made of rubber, by way of example.

In the initial state illustrated in FIG. 1A, the lower end of the pressing portion 113B is in contact with the upper end of the metal contact 130. In this state, the lower end of the pressing portion 113B pushes the upper end of the metal contact 130 slightly downward, and the metal contact 130 is compressed in the vertical direction slightly as compared with its natural length. This is to prevent rattling between the pressing portion 113B and the metal contact 130 in the initial state.

When a pressing operation is performed on the input apparatus 100 from the initial state illustrated in FIG. 1A, the pressing portion 113B crushes down the central portion of the metal contact 130 to invert the metal contact 130, as illustrated in FIG. 1B.

The electrostatic sensor 120 includes the electrodes 120A and 120B. The electrode 120A is disposed on the upper surface of the base 111A of the fixed portion 110A. The electrode 120B is disposed on the lower surface of the covering portion 111B of the operating portion 110B. The electrodes 120A and 120B are opposed to each other and are connected to the processor 140.

The output value of the electrostatic sensor 120 is a voltage value and based on the capacitance of the electrostatic sensor 120. The capacitance of the electrostatic sensor 120 is the capacitance between the electrodes 120A and 120B. When a pressing operation is performed from the initial state illustrated in FIG. 1A, the distance between the electrodes 120A and 120B (the inter-electrode distance) decreases to vary the capacitance, and the output value (voltage value) of the electrostatic sensor 120 varies with the variation in the capacitance. Thus, the capacitance of the electrostatic sensor 120 is determined from the output value (voltage value) of the electrostatic sensor 120.

The metal contact 130 may be a metal dome, which is inverted under pressure, and is a metal spring made of a metal member. The metal contact 130 includes a domical portion 131 and a base 132. The domical portion 131 is a portion that protrudes in a domical shape at the top of the central portion of the metal contact 130 and that can be inverted. The base 132 is a portion extending around the domical portion 131 and surrounding the periphery of the domical portion 131 in plan view.

When the input apparatus 100 is subjected to a pressing operation in which the upper surface of the domical portion 131 is pressed downward by the pressing portion 113B, the domical portion 131 of the metal contact 130 is inverted with respect to the base 132 into the crushed state as illustrated in FIG. 1B. The reaction force of the domical portion 131 inverted by the inverting action of the metal contact 130 is transmitted to the covering portion 111B via the pressing portion 113B to provide a feel to the fingertip FT of the operator. In other words, the metal contact 130 generates an operation feel in the pressing direction to the operator with the pressing operation of the operating portion 110B.

As described above, the metal contact 130 is used only to provide a feel to the operator, and the electrical connecting status of the metal contact 130 is not used to determine whether the pressing operation has been completed. For this reason, there is no need to connect the metal contact 130 to a circuit or the like in the input apparatus 100. Since the metal contact 130 is used only to provide a feel to the operator, a member that can provide a feel may be used instead of the metal contact 130. Such a member may be made of metal or non-metal.

The processor 140 determines whether a pressing operation has been performed based on the output value of the electrostatic sensor 120. The processor 140 determines that a pressing operation has been completed when the electrostatic sensor 120 outputs an output value corresponding to feel characteristics representing the characteristics of the pressing force on the metal contact 130 with respect to the elapsed time during the pressing operation. The details of this determination will be described later.

FS Characteristics

Figure 2:
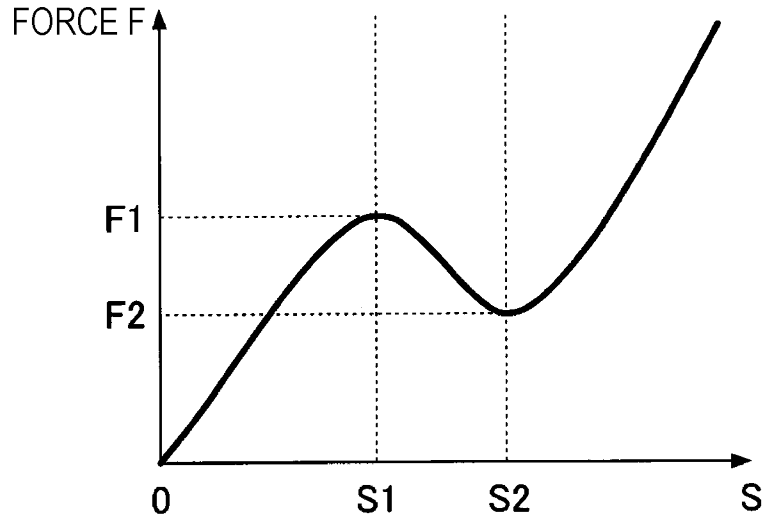
FIG. 2 is a graph illustrating force-stroke (FS) characteristics when a pressing operation on the input apparatus is completed.

FIG. 2 is a graph illustrating force-stroke (FS) characteristics when the input apparatus 100 is pressed. The horizontal axis represents a stroke S to press the operating portion 110B of the input apparatus 100 downward, and the vertical axis represents a force F required to press the operating portion 110B downward. The force F is a pressing force, which is equal to the reaction force of the metal contact 130 under pressure. The FS characteristics illustrated in FIG. 2 is the FS characteristics of the entire input apparatus 100.

As shown in FIG. 2, when the stroke S is zero, the force F is zero. To increase the stroke S by starting a pressing operation, the force F is to be increased. When the force F reaches a maximum value F1, the stroke S reaches S1. At that time, the metal contact 130 is immediately before being inverted.

When the operating portion 110B is pressed further, the stroke S exceeds S1, but the force F becomes less than the maximum value F1 because the metal contact 130 is inverted. When the operating portion 110B is pressed still further, the force F takes a minimum value F2 when the stroke S is at S2, and when the operating portion 110B is pressed still further, the force F increases again from the minimum value F2.

The state in which the stroke S is at S2 is a state in which the pressing portion 113B crushes the inverted metal contact 130. The input apparatus 100 is configured to determine that the pressing operation has been completed when the metal contact 130 is crushed, not to use the electrical connecting state of the metal contact 130 in determining that the pressing operation has been completed. The details will be described later with reference to FIG. 3.

The state in which the force F increases again from the minimum value F2 at the stroke of S2 is a state in which the pressing portion 113B further presses the inverted, crushed metal contact 130 to press the base 111A of the fixed portion 110A via the crushed metal contact 130, so that the stroke S increases slightly from S2 because of the deflection of the casing 110, etc.

When determining whether the pressing operation has been completed, the input apparatus 100 uses, not the FS characteristics themselves, but feel characteristics representing the characteristics of the pressing force on the metal contact 130 with respect to an elapsed time during the pressing operation. The pressing force on the metal contact 130 is a pressing force required for the pressing operation on the metal contact 130. The feel characteristics will be described with reference to FIG. 3.

Feel Characteristics and Time-Varying Characteristics of Capacitance

Figure 3:
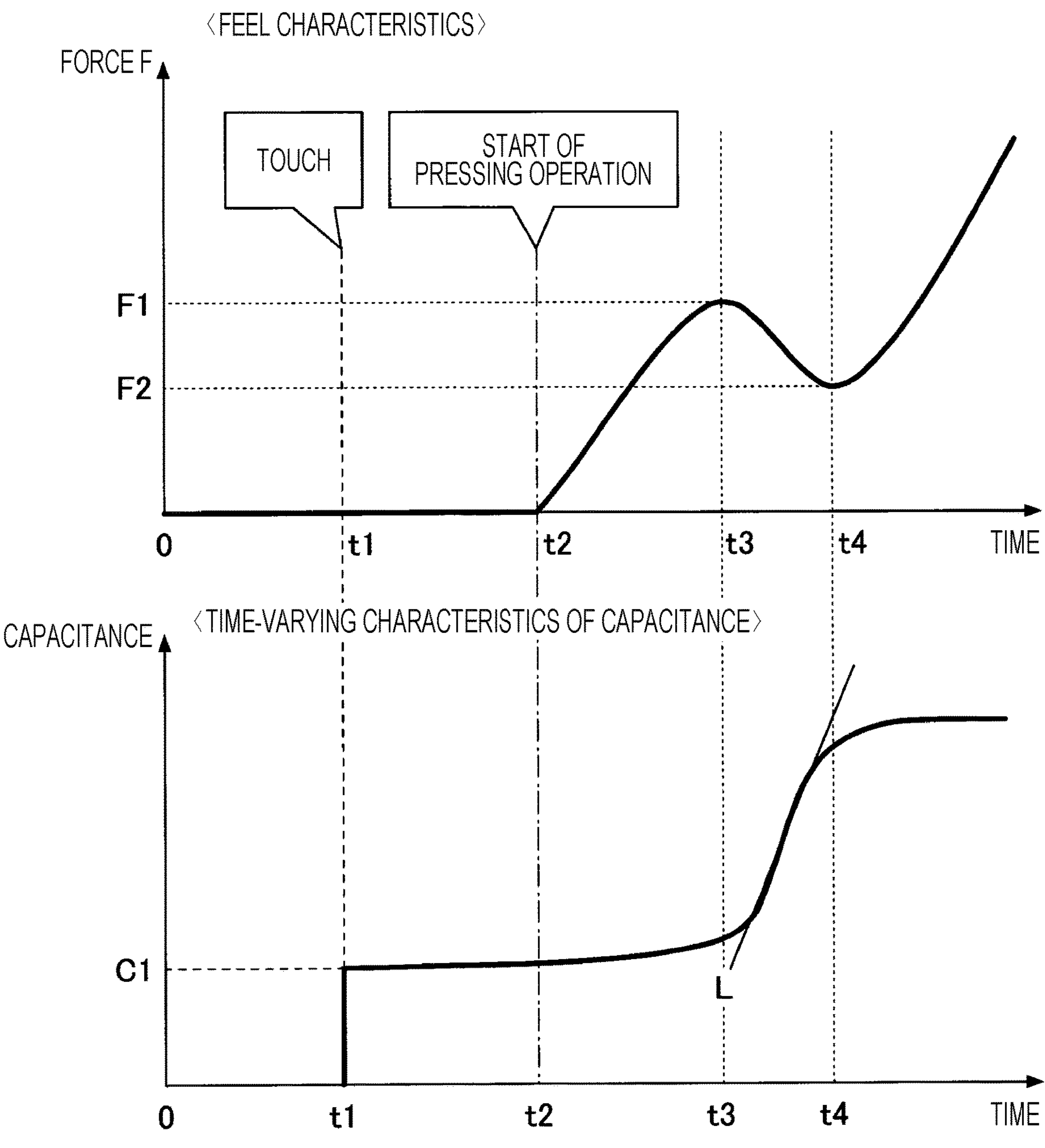
FIG. 3 is a graph illustrating feel characteristics that a processor of the input apparatus uses.

FIG. 3 is a graph illustrating feel characteristics that the processor 140 of the input apparatus 100 uses. In FIG. 3, the upper part illustrates an example of the feel characteristics, and the lower part illustrates an example of the time-varying characteristics of the capacitance. In FIG. 3, the horizontal axis represents time, the vertical axis at the upper part represents the force F, the vertical axis at the lower part represents the capacitance of the electrostatic sensor 120.

The feel characteristics illustrated at the upper part of FIG. 3 are the characteristics of a pressing force required for a pressing operation on the metal contact 130 with respect to the elapsed time during the pressing operation. The pressing operation on the input apparatus 100 is an operation to press the operating portion 110B downward. In the case where a plurality of operators performs the pressing operation using a normal operation, the time required from the start of the pressing operation to completion seems to be within a certain period of time. The normal operation method refers to performing the operation in a normal way, not performing the pressing operation, for example, intentionally slowly or quickly.

The feel characteristics at the upper part of FIG. 3 represent a variation in the force F in the average time required when a plurality of operators performs the pressing operation in a normal operating manner. In one example, the fingertip FT touches the operating portion 110B at time t1, the fingertip FT starts the pressing operation at time t2, the force F reaches the maximum value F1 at time t3, and the force F decreases to the minimum value F2 at time t4. Performing the pressing operation in the average time required provides the feel characteristics illustrated at the upper part of FIG. 3, in which the horizontal axis of the FS characteristics illustrated in FIG. 2 is converted to the time axis.

The period from time t2 to time t3 in the feel characteristics is an example of a first pressure deformation period during which the metal contact 130 is deformed. The period from time t3 to time t4 in the feel characteristics is an example of an inverse period during which the metal contact 130 is inverted. The period from time t4 on in the feel characteristics is an example of a second pressure deformation period during which the metal contact 130 is deformed. The feel characteristics may have the first pressure deformation period, the inverse period, and the second pressure deformation period in this order.

The time-varying characteristics of the capacitance illustrated at the lower part of FIG. 3 represent a time variation in the capacitance of the electrostatic sensor 120 when the pressing operation is performed so that the feel characteristics illustrated at the upper part of FIG. 3 are obtained. The capacitance is a count value. When the fingertip FT touches the operating portion 110B at time t1, the capacitance increases to Cl. From time t1 to time t2 at which the pressing operation is started, the distance between the electrodes 120A and 120B of the electrostatic sensor 120 does not change, and the capacitance stays substantially constant.

When the pressing operation is started at time t2, the stroke S begins to increase to decrease the distance between the electrodes 120A and 120B, so that the capacitance begins to increase gradually. When the metal contact 130 is inverted to begin to crush at time t3, the distance between the electrodes 120A and 120B decreases rapidly, so that the capacitance increases rapidly toward time t4 at which the metal contact 130 crushes completely. From time t4 on, the distance between the electrodes 120A and 120B does not change, so that the capacitance stays substantially constant. Thus, the time-varying characteristics of the capacitance vary based on the feel characteristics.

In the case where a plurality of operators performs the pressing operation in the normal operating manner, the percentage of an increase in capacitance when the metal contact 130 is inverted and crushed as in the period from time t3 to time t4 seems to be within a certain range.

The percentage of the increase in capacitance has a slope that represents an increase in the capacitance with respect to the elapsed time. In other words, when the slope of the capacitance of the electrostatic sensor 120 falls within a certain slope range, the pressing operation of the operator can be regarded as being completed.

In the time-varying characteristics of the capacitance illustrated at the lower part of FIG. 3 a straight line L that represents an example of the slope of the capacitance from time t3 to time t4 is shown in solid. The straight line L represents the slope of the capacitance in a certain period from time t3 to time t4.

When the slope of the capacitance of the electrostatic sensor 120 falls within a certain range, the input apparatus 100 determines that the pressing operation has been completed. This is because the slope of the capacitance when the pressing operation is performed in an average time required to vary the capacitance rapidly is regarded as being within a certain slope range.

The characteristics from time t3 to time t4 in the time-varying characteristics of the capacitance are characteristics of the feel characteristics responsive to a variation in the force F from time t3 to time t4. For this reason, the output value of the electrostatic sensor 120 from time t3 to time t4 is the output value of the feel characteristics responsive to a variation in the force F from time t3 to time t4.

When the electrostatic sensor 120 outputs an output value corresponding to the feel characteristics that represent the characteristics of the pressing force on the metal contact 130 with respect to the elapsed time during the pressing operation, the input apparatus 100 determines that the pressing operation has been completed. Since the period from time t3 to time t4 of the feel characteristics is an inverse period, the processor 140 determines that the pressing operation has been completed when the output value of the electrostatic sensor 120 corresponds to the slope of the feel characteristics during the inverse period.

The input apparatus 100 improves the reliability of the determination by enhancing the robustness against noise to increase the accuracy of determination of completion of the pressing operation by using not only a variation in the value of the capacitance of the electrostatic sensor 120 but also a slope representing a time variation in the capacitance.

Figure 4A:
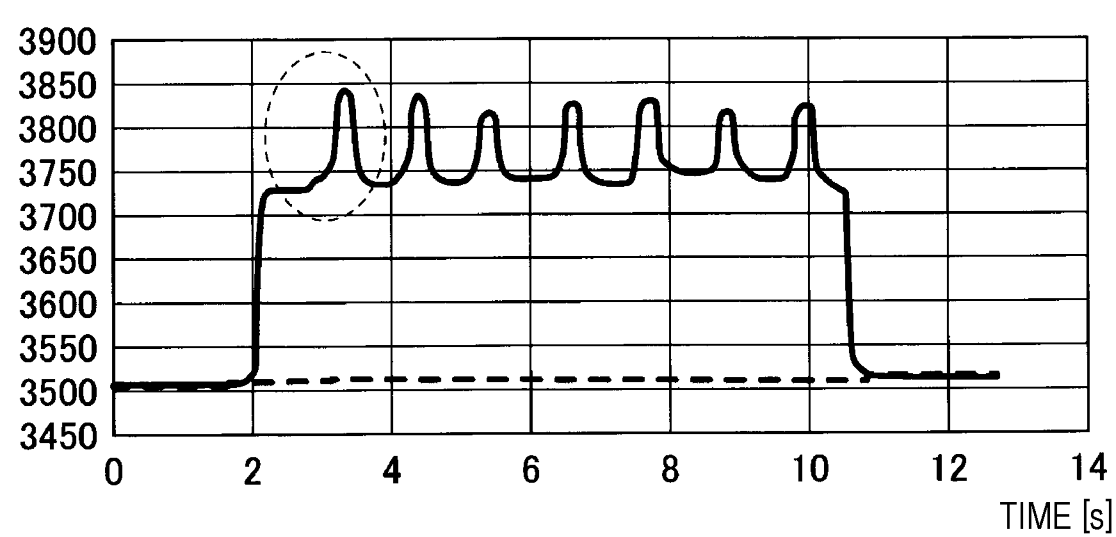
FIG. 4A is a graph illustrating how to determine the slope of time-varying characteristics of the capacitance.
Figure 4B:
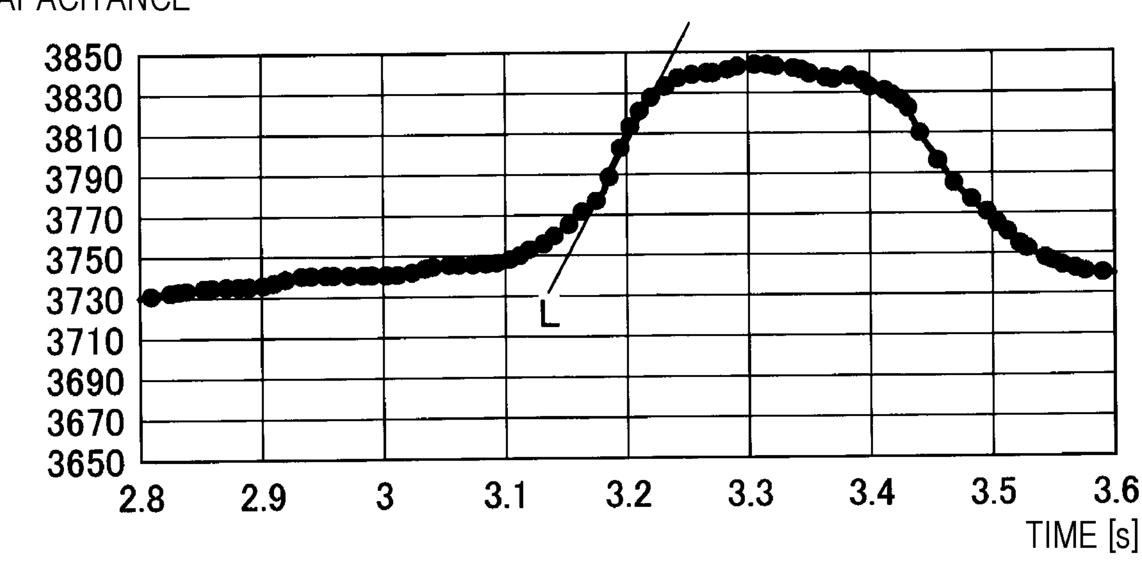
FIG. 4B is a graph illustrating how to determine the slope of time-varying characteristics of the capacitance.

How to Determine Slope of Capacitance and Method for Determining Whether Pressing Operation Has Been Completed FIGS. 4A and 4B are graphs illustrating how to determine the slope of the time-varying characteristics of capacitance. In FIGS. 4A and 4B, the horizontal axis represents time (s), and the vertical axis represents capacitance (count value). FIG. 4A plots the time-varying characteristics of the capacitance with a solid line and indicates the baseline capacitance with a dashed line.

FIG. 4A illustrates the time-varying characteristics of the capacitance when a pressing operation is repeated seven times consecutively, by way of example. FIG. 4B illustrates the time-varying characteristics of the capacitance when the first pressing operation is performed. FIG. 4B illustrates the vertical axis and the horizontal axis on a larger scale than FIG. 4A. FIG. 4B illustrates each of the capacitances, or count values, obtained at predetermined sampling intervals with a point.

In the time-varying characteristics of the capacitance as in FIG. 4B, the slope of the capacitance is determined by dividing the difference between each capacitance and the capacitance obtained at sampling five times earlier by the time difference. FIG. 4B illustrates the slope determined for the capacitance at time 3.22(s), in an example, with the straight line L.

When the capacitance varies rapidly with a steep slope as indicated by the straight line L, a relatively large slope of the capacitance seems to be formed consecutively. This is because when the operator is completing the pressing operation, the capacitance seems to vary rapidly over some period of time, as the time-varying characteristics of the capacitance from time t3 to time t4, illustrated in FIG. 3, and when the capacitance varies rapidly, a relatively large slope of the capacitance seems to be formed consecutively.

For this reason, when the slope of the capacitance becomes greater than or equal to a first threshold THL, and a state in which the slope of the capacitance is greater than or equal to the first threshold THL and less than or equal to a second threshold THH is continued a predetermined number of times or more, the input apparatus 100 determines that the pressing operation has been completed. The fact that the state in which the slope of the capacitance is greater than or equal to the first threshold THL and less than or equal to the second threshold THH continues a predetermined number of times or more indicates that this state occurs over a predetermined period or more. For this reason, when the degree of time variation in the output value of the electrostatic sensor 120 corresponds to the slope of the feel characteristics for a predetermined period or more, the processor 140 determines that the pressing operation has been completed.

Figure 5:
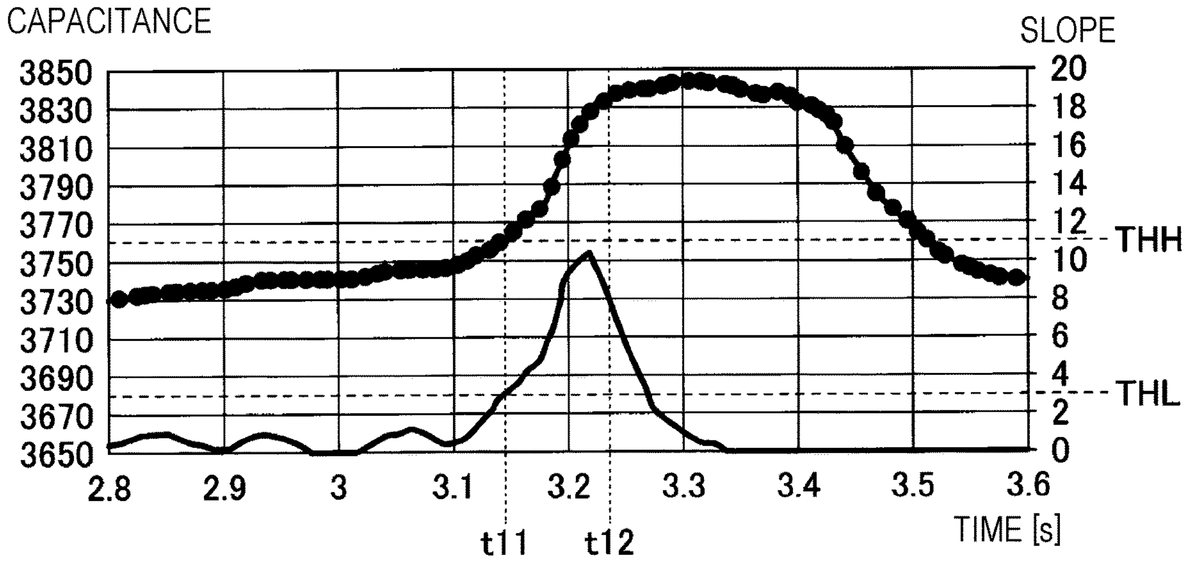
FIG. 5 is a graph illustrating a temporal variation in the capacitance.

The first threshold THL is a threshold corresponding to the lower limit of the slope of the capacitance, and the second threshold THH is a threshold corresponding to the upper limit of the slope of the capacitance. The first threshold THL and the second threshold THH are illustrated in FIG. 5. In this case, it is determined that the pressing operation has been completed when the slope of the capacitance becomes greater than or equal to the first threshold THL and, thereafter, a state in which the slope of the capacitance is greater than or equal to the first threshold THL and less than or equal to the second threshold THH is continued a predetermined number of times or more. Alternatively, it may be determined that the pressing operation has been completed when the slope of the capacitance becomes greater than or equal to the first threshold THL and, thereafter, the state in which the slope of the capacitance is greater than or equal to the first threshold THL continues a predetermined number of times or more.

Temporal Variation in Capacitance

FIG. 5 is a graph illustrating a temporal variation in the capacitance. In FIG. 5, the horizontal axis represents time (s), the vertical axis on the left represents capacitance (count value), and the vertical axis on the right represents the slope of the capacitance. FIG. 5 illustrates, in addition to the same characteristics as the time-varying characteristics of the capacitance illustrated in FIG. 4B, the distribution of the slope of the capacitance obtained by dividing the difference between each capacitance and the capacitance five times earlier by the time difference in solid. FIG. 5 also illustrates the first threshold THL and the second threshold THH of the slope of the capacitance.

Here, in one example, the first threshold THL is 3, the second threshold THH is 11, and the predetermined number of consecutive times to determine that the pressing operation has been completed is eight. The slope of the capacitance is obtained by dividing the difference between each capacitance and the capacitance obtained at sampling five times earlier by the time difference.

In FIG. 5, the capacitance begins to increase from about 3.1(s), and the slope of the capacitance becomes greater than or equal to the first threshold THL at time t11 between 3.1(s) and 3.2(s). After time t11, the slope of the capacitance greater than or equal to the first threshold THL continues, and after 3.2(s), the slope of the capacitance reaches its maximum value. The maximum value of the slope of the capacitance is less than or equal to the second threshold THH. Thereafter at time t12, the slope of the capacitance becomes greater than or equal to the first threshold THL and less than or equal to the second threshold THH, which continues over eight times. For this reason, the input apparatus 100 determines that the pressing operation has been completed.

Temporal Variation in Capacitance for Comparison

Figure 6A:
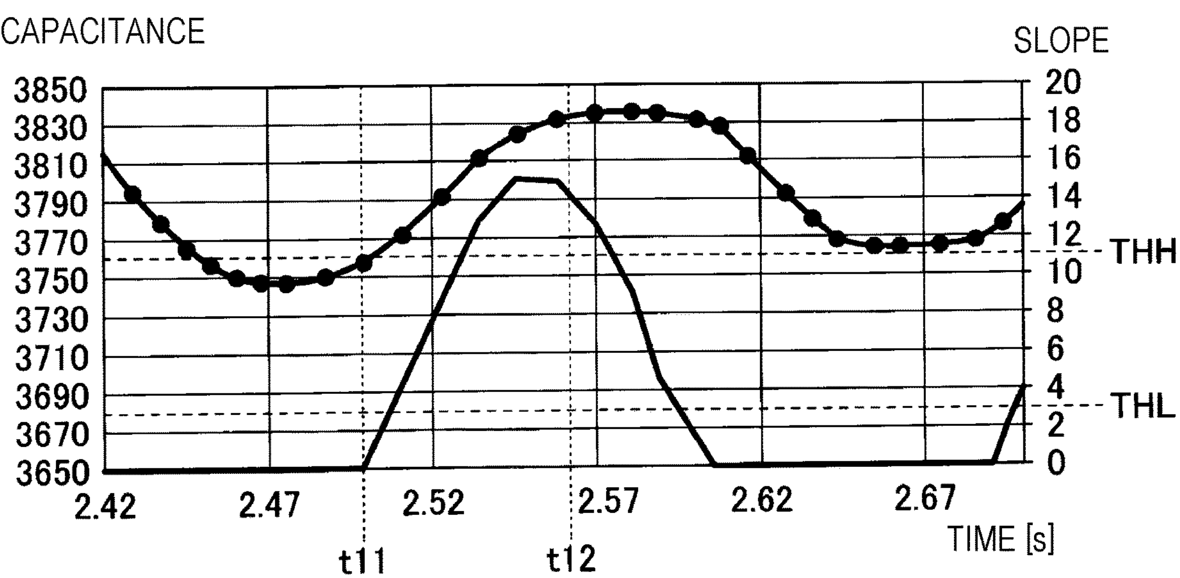
FIG. 6A illustrates a temporal variation in capacitance for comparison.
Figure 6B:
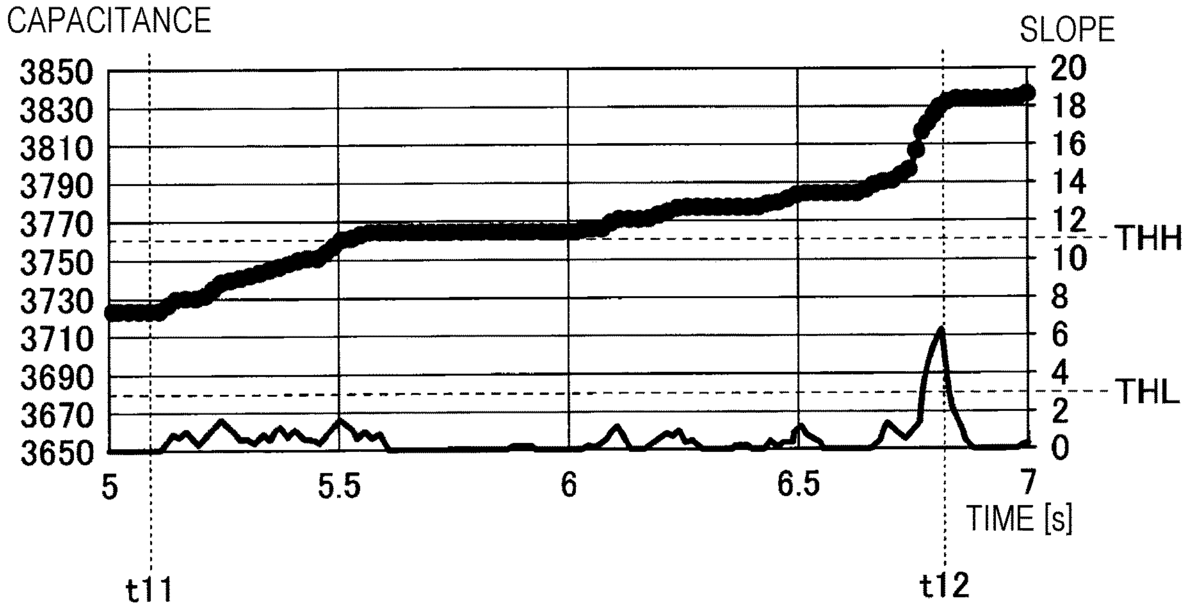
FIG. 6B illustrates a temporal variation in capacitance for comparison.

FIGS. 6A and 6B are graphs illustrating temporal variations in capacitance for comparison. FIG. 6A illustrates a temporal variation in capacitance when a pressing operation is performed quickly. FIG. 6B illustrates a temporal variation in capacitance when a pressing operation is performed slowly. To perform a pressing operation quickly is to perform the pressing operation so quickly that would not be performed by a plurality of operators in the normal operating manner. To perform a pressing operation slowly is to perform the pressing operation so slowly that would not be performed by a plurality of operators in the normal operating manner.

FIG. 6A illustrates variations in the capacitance and the slope during a shorter period than in FIG. 5 to illustrate a temporal variation in the capacitance when the pressing operation is performed quickly. If the pressing operation is performed quickly, the number of samples of the capacitance decreases, and the capacitance increases rapidly in a shorter time, so that the slope of the capacitance becomes larger. For this reason, the slope of the capacitance became greater than or equal to the first threshold THL and less than or equal to the second threshold THH at consecutive two times. At about 2.53(s), the slope of the capacitance exceeded the second threshold THH. Thus, if the pressing operation is performed quickly, the input apparatus 100 does not determine that the pressing operation has been completed. Also in case of instantaneous noise, the input apparatus 100 does not determine that the pressing operation has been completed.

FIG. 6B illustrates variations in the capacitance and the slope during a longer period than in FIG. 5 to illustrate a temporal variation in the capacitance when the pressing operation is performed slowly. If the pressing operation is performed slowly, the number of samples of the capacitance increases, and the capacitance increases gradually over a long period of time, so that the slope of the capacitance becomes smaller. For this reason, the slope of the capacitance became greater than or equal to the first threshold THL and less than or equal to the second threshold THH at about time 6.8(s) at consecutive six times. Thus, if the pressing operation is performed slowly, the input apparatus 100 does not determine that the pressing operation has been completed. In case of noise that changes gradually with time, the input apparatus 100 does not determine that the pressing operation has been completed.

Flowchart

Figure 7:
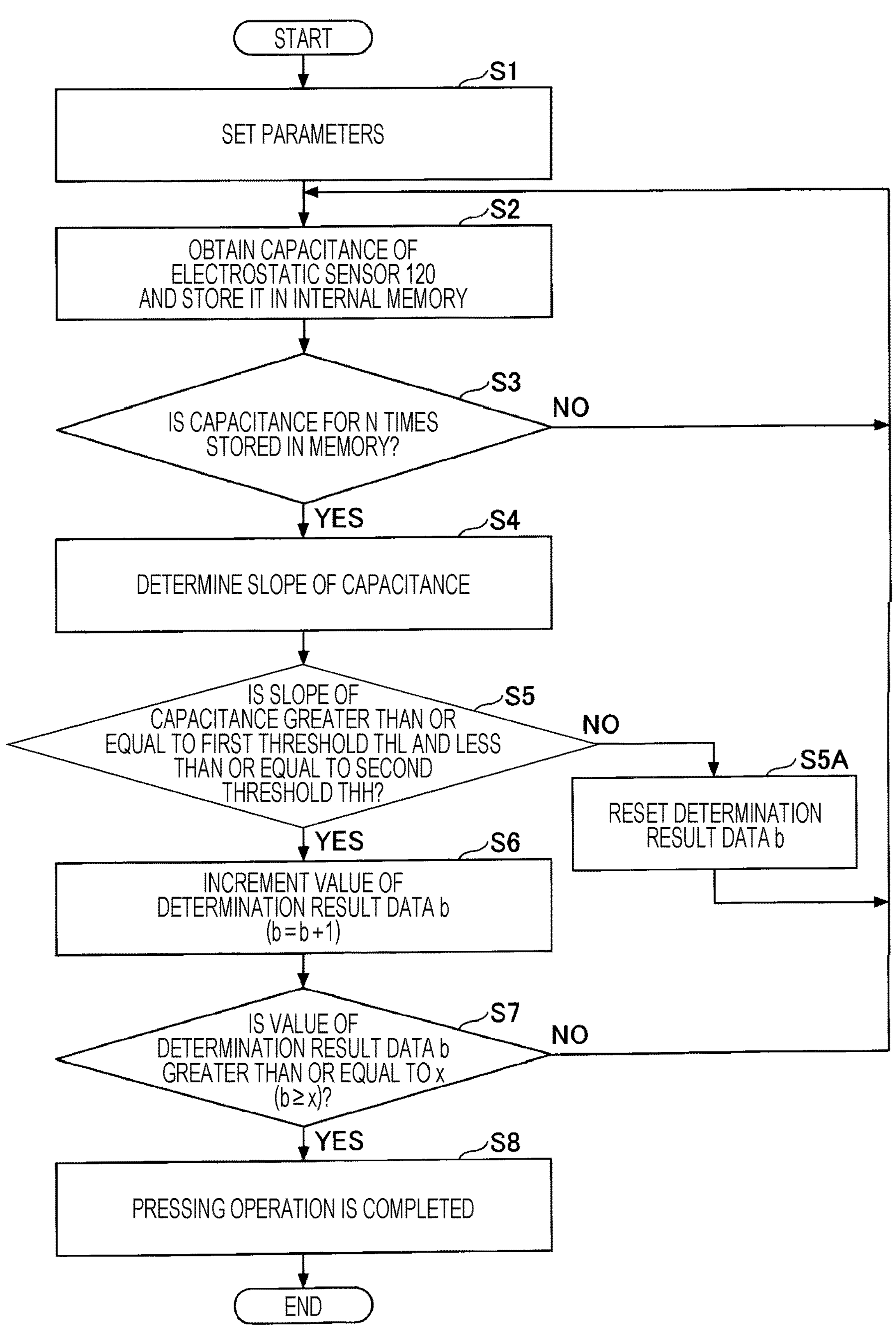
FIG. 7 is a flowchart for a process that a processor of the input apparatus executes.

FIG. 7 is a flowchart for a process that the processor 140 of the input apparatus 100 executes. The process illustrated in FIG. 7 is an input determination method executed by the input apparatus 100.

Upon starting the process, the processor 140 sets parameters (step S1). Examples of the parameters include the first threshold THL, the second threshold THH, the number of the time of previous capacitance sampling used to determine the capacitance, and the consecutive number of times the slope of the capacitance becomes greater than or equal to the first threshold THL and less than or equal to the second threshold THH. In the example illustrated in FIG. 5, the first threshold THL is 3, the second threshold THH is 11, the number of the time of previous capacitance sampling is 5, and the consecutive number of times is 8.

All of the above parameters can be adjusted in step S1. Among them, the first threshold THL and the second threshold THH define the range of the slope of the capacitance. The consecutive number of times the slope of the capacitance becomes greater than or equal to the first threshold THL and less than or equal to the second threshold THH corresponds to a predetermined period during which the slope of the capacitance is continuously greater than or equal to the first threshold THL and less than or equal to the second threshold THH. For this reason, the range of the slope of the capacitance and the predetermined period during which the slope of the capacitance is continuously greater than or equal to the first threshold THL and less than or equal to the second threshold THH can be adjusted.

The processor 140 obtains the capacitance of the electrostatic sensor 120 and stores the capacitance in an internal memory (step S2). Through the process of step S2, the capacitance is sampled at predetermined sampling intervals. The processor 140 stores the capacitance obtained N times of sampling in the memory. N is 6, one greater than 5, because the number of the time of previous capacitance sampling is 5. The processor 140 deletes the capacitance sampled 6 earlier in sequence.

The processor 140 determines whether the capacitance of N times is stored in the memory (step S3). If the processor 140 determines that the capacitance of N times is not stored in the memory (S3: NO), then the processor 140 returns the processing procedure to step S2.

If in step S3 the processor 140 determines that the capacitance of N times is stored in the memory (S3: YES), then the processor 140 calculates the slope of the capacitance by dividing the difference between the capacitance sampled in step S2 at the current control interval and the capacitance sampled N−1 times earlier by the time of N−1 sampling intervals (step S4). In the example of FIG. 5, the slope of the capacitance is determined by dividing the difference between the current capacitance sampled and the capacitance sampled 5 times earlier by the time of 5 sampling intervals.

The processor 140 determines whether the slope of the capacitance is greater than or equal to the first threshold THL and less than or equal to the second threshold THH (step S5). In the example illustrated in FIG. 5, the processor 140 determines whether the slope of the capacitance is in the range greater than or equal to the first threshold THL and less than or equal to the second threshold THH.

If the processor 140 determines that the slope of the capacitance is not greater than or equal to the first threshold THL and less than or equal to the second threshold THH (S5: NO), then the processor 140 resets determination result data b describing the determination result (step S5A). Upon completion of the process of step S5A, the processor 140 returns the processing procedure to step S2. This is an embodiment in which the determination result data b describing the determination result is reset. Alternatively, in step S5A, the processor 140 may not increment the determination result data b or may decrement the determination result data b. This also allows for setting a predetermined continuous period in which the slope of the capacitance is greater than or equal to the first threshold THL and less than or equal to the second threshold THH.

In step S5, if the processor 140 determines that the slope of the capacitance is greater than or equal to the first threshold THL and less than or equal to the second threshold THH (S5: YES), then the processor 140 increments the value of the determination result data b describing the determination result (step S6).

The processor 140 determines whether the value of the determination result data b is greater than or equal to x (step S7). The value x represents the number of consecutive times of the state in which the slope of the capacitance is greater than or equal to the first threshold THL and less than or equal to the second threshold THH. For example, if x is set to 8, it is determined in the process of step S7 whether the slope of the capacitance is continuously greater than or equal to the first threshold THL and less than or equal to the second threshold THH over eight times, as illustrated with reference to the example in FIG. 5.

If the processor 140 determines that the value of the determination result data b is not greater than or equal to x (S7: NO), then the processor 140 returns the processing procedure to step S2.

If the processor 140 determines that the value of the determination result data b is greater than or equal to x (S7: YES), then the processor 140 determines that the pressing operation has been completed (step S8). In the example illustrated in FIG. 5, when the slope of the capacitance is greater than or equal to the first threshold THL and less than or equal to the second threshold THH continuously over eight times or more, the processor 140 determines that the pressing operation has been completed.

Thus, when the electrostatic sensor 120 outputs an output value corresponding to feel characteristics representing the characteristics of the pressing force on the metal contact 130 with respect to the elapsed time during the pressing operation, the input apparatus 100 determines that the pressing operation has been completed.

This allows for providing the input apparatus 100 in which erroneous determination is reduced or eliminated even in a situation in which the capacitance is varied by, for example, noise or an operation different from the operation to be detected.

In some cases, determination of whether an operation has been performed based on a variation in capacitance is difficult. In particular, if a determination of whether an important operation, such as an operation for determining whether the pressing operation has been completed, is made based on a variation in capacitance is erroneous, the problem of reliability as the input apparatus arises. To cope with this, the input apparatus 100 determines that the pressing operation has been completed when the electrostatic sensor 120 outputs an output value corresponding to the feel characteristics representing the characteristics of the pressing force on the metal contact 130 with respect to the elapsed time during the pressing operation. This provides high robustness against noise, thereby improving the reliability.

The operating portion 110B is displaceable in the pressing direction by the pressing operation. The operating portion 110B includes the pressing portion 113B that transmits the pressing force by the pressing operation to the metal contact 130. The metal contact 130 is deformed under the pressing force to provide an operation feel to the operator. This reduces or eliminates an erroneous determination even in a situation in which the capacitance varies because of, for example, noise or an operation different from the operation to be detected and provides a feel caused by the deformation of the metal contact 130.

The metal contact 130 has the domical portion 131 that is inverted and deformed under a predetermined pressing force, and the feel characteristics represent the characteristics of the pressing force at the inverted action of the metal contact 130. This allows reducing or eliminating an erroneous determination to be even in a situation in which the capacitance varies because of, for example, noise or an operation different from the operation to be detected, and providing a feel caused by the inverting action of the metal contact 130. Since the inverting action of the metal contact 130 provides a tactile feel, the input apparatus 100 with a preferable operation feel can be provided.

The feel characteristics include the first pressure deformation period, the inverse period, and the second pressure deformation period in this order, and the processor 140 determines that the pressing operation has been completed when the output value of the electrostatic sensor 120 corresponds to the slope of the feel characteristics during the inverse period. This allows providing the input apparatus 100 in which a variation in capacitance due to noise or an operation other than the pressing operation is precluded to reduce or eliminate an erroneous determination effectively. The feel characteristics may include the first pressure deformation period and the inverse period in this order. For example, with a feel generator in which the operation is completed in the inverse period, the feel characteristics do not have to include the second pressure deformation period.

The processor 140 determines that the pressing operation has been completed when the degree of time variation in the output value of the electrostatic sensor 120 corresponds to the slope of the feel characteristics over a predetermined period or more. Since the time variation corresponds to the slope of the feel characteristics over a predetermined period or more, the input apparatus 100 can preclude a variation in capacitance due to noise or an operation other than the pressing operation to reduce or eliminate an erroneous determination effectively.

Furthermore, the processor 140 determines that the pressing operation has been completed when the degree of time variation in the output value of the electrostatic sensor 120 is within a predetermined slope range of the feel characteristics during a predetermined period. This allows for determining that the pressing operation has been completed when the pressing operation is performed in the normal operating manner, providing the input apparatus 100 in which an erroneous determination is effectively reduced or eliminated.

Since the predetermined period during which whether the pressing operation has been completed and the predetermined range of the slope are adjustable, the influence of a variation in the value of the capacitance due to temperature or other external factors can be cancelled. Furthermore, the criteria for determining whether the pressing operation has been completed can be adjusted in accordance with the application and so on, providing a user-friendly input apparatus 100.

Since the electrostatic sensor 120 is a capacitance electrostatic sensor 120 in which the capacitance varies according to the pressing operation on the operating portion 110B, the input apparatus 100 can be provided which capable of determining appropriately whether the pressing operation has been completed according to the capacitance.

First Modification

Figure 8A:
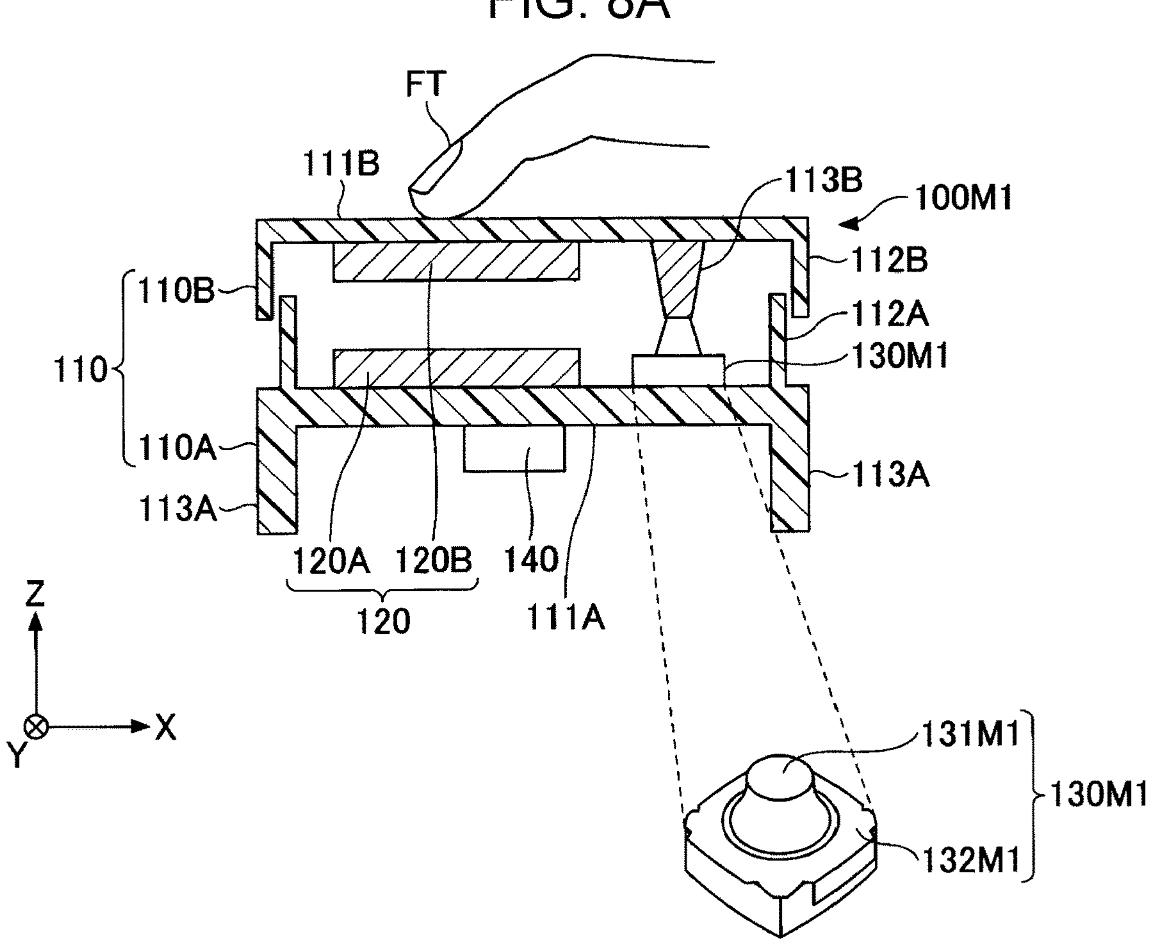
FIG. 8A is a cross-sectional view of an input apparatus according to a first modification of the embodiment, illustrating an example of the configuration and operation thereof.
Figure 8B:
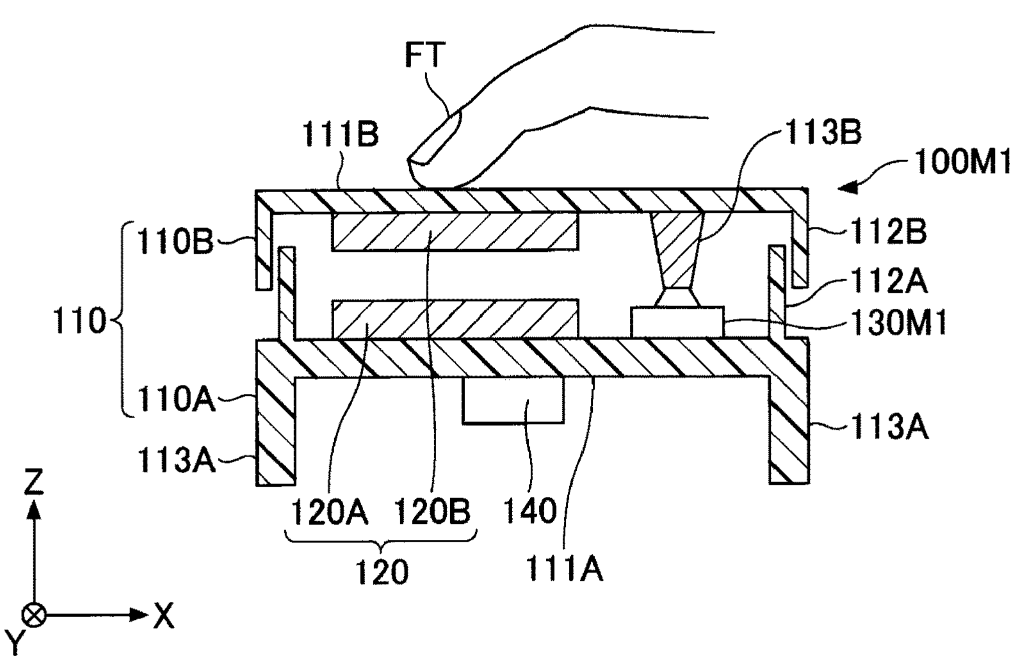
FIG. 8B is a cross-sectional view of the input apparatus according to the first modification of the embodiment, illustrating an example of the configuration and operation thereof.

FIGS. 8A and 8B are cross-sectional views of an input apparatus 100M1 according to a first modification of the embodiment, illustrating an example of the configuration and operation thereof. The input apparatus 100M1 has a configuration including a tactile switch (a push button switch) 130M1 as a feel generator, instead of the metal contact 130 of the input apparatus 100 illustrated in FIGS. 1A and 1B.

The tactile switch 130M1 includes a button 131M1 and a base 132M1 and provides a tactile feel as with the metal contact 130 when the button 131M1 is pressed against the base 132M1. Using such a tactile switch 130M1 instead of the metal contact 130 provides the input apparatus 100M1 in which an erroneous determination can be reduced or eliminated even in a situation in which the capacitance varies because of, for example, noise or an operation different from the operation to be detected.

Second Modification

Figure 9A:
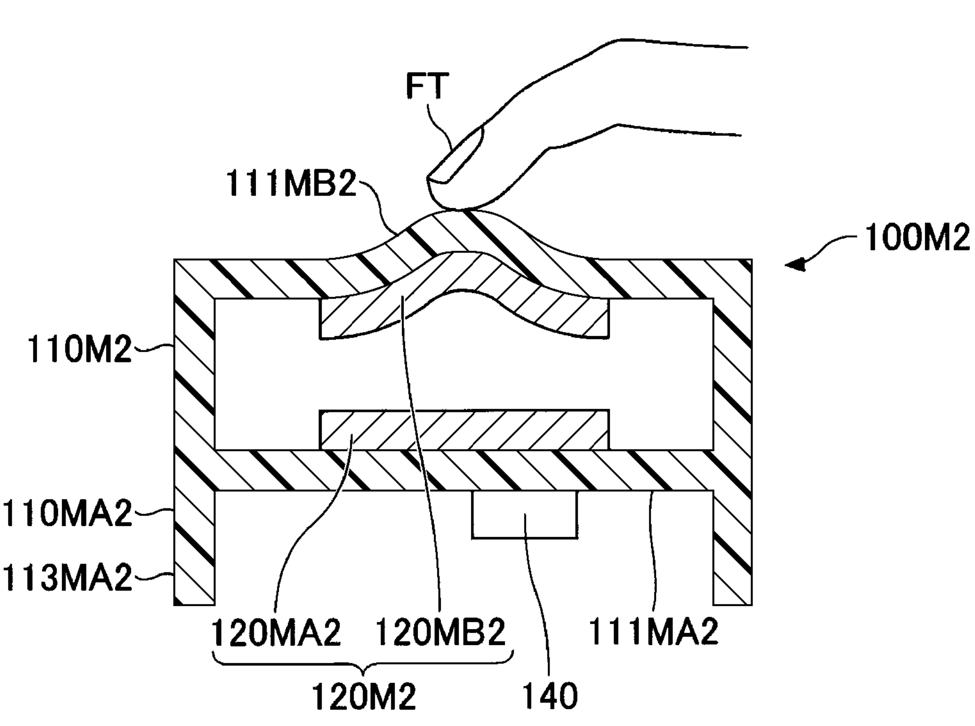
FIG. 9A is a cross-sectional view of an input apparatus according to a second modification of the embodiment, illustrating an example of the configuration and operation thereof.
Figure 9B:
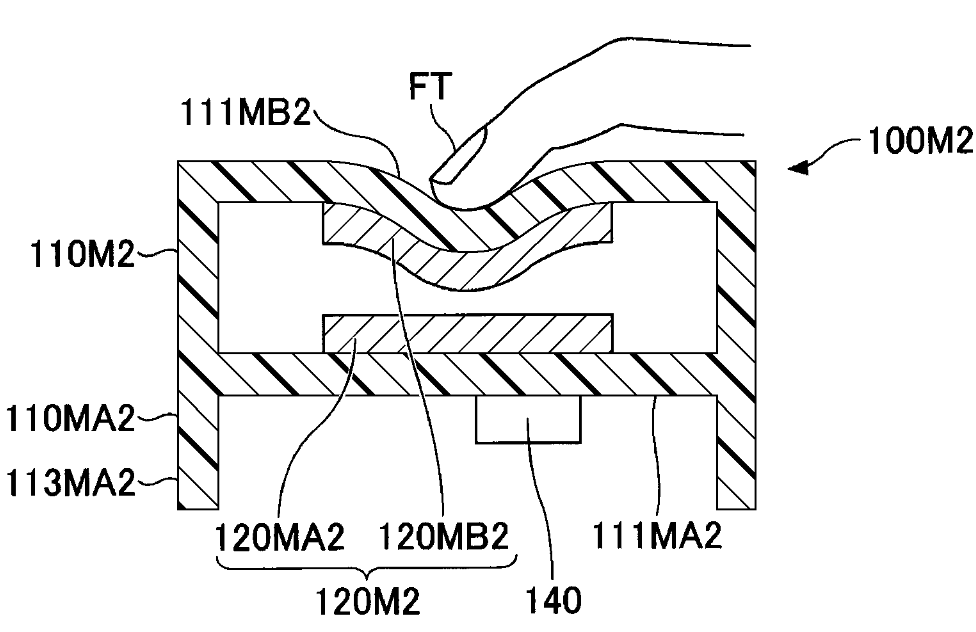
FIG. 9B is a cross-sectional view of the input apparatus according to the second modification of the embodiment, illustrating an example of the configuration and operation thereof.

FIGS. 9A and 9B are cross-sectional views of an input apparatus 100M2 according to a second modification of the embodiment, illustrating an example of the configuration and operation thereof. The input apparatus 100M2 has a configuration including a casing 110M2 and an electrostatic sensor 120M2, instead of the casing 110 and the electrostatic sensor 120 of the input apparatus 100 illustrated in FIGS. 1A and 1B, respectively.

The casing 110M2 has a configuration in which the fixed portion 110A and the operating portion 110B of the casing 110 illustrated in FIGS. 1A and 1B are formed into a single unit, and a portion corresponding to the covering portion 111B of the casing 110 illustrated in FIGS. 1A and 1B is replaced with a domical, deformable covering portion 111MB2. The covering portion 111MB2 is an example of the feel generator.

The casing 110M2 includes a base 111MA2, a leg 113MA2, and the covering portion 111MB2. The base 111MA2 and the leg 113MA2 correspond to the base 111A and the leg 113A of the casing 110 illustrated in FIGS. 1A and 1B, respectively.

The central portion of the covering portion 111MB2, when touched but not pressed as illustrated in FIG. 9A, protrudes upward in a domical shape. The covering portion 111MB2, when pressed, is inverted as illustrated in FIG. 9B to provide a tactile feel to the fingertip FT.

The electrostatic sensor 120M2 includes electrodes 120MA2 and 120MB2. The electrode 120MB2 is deformable and, when the covering portion 111MB2 protrudes upward in a domical shape, as illustrated in FIG. 9A, is deformed according to the shape of the covering portion 111MB2. When the covering portion 111MB2 is pressed to be inverted, as illustrated in FIG. 9B, the electrode 120MB2 is deformed such that the central portion protrudes downward. This causes the distance between the electrode 120MA2 and the electrode 120MB2 to be shorter than that illustrated in FIG. 9A to increase the capacitance of the electrostatic sensor 120M2. The deformable electrode 120MB2 can be made of, for example, indium tin oxide (ITO). The electrode 120MA2 is not deformable but may be similarly made of ITO.

The input apparatus 100M2 can reduce or eliminate an erroneous determination even in a situation in which the capacitance varies because of, for example, noise or an operation different from the operation to be detected, as with the input apparatus 100 illustrated in FIGS. 1A and 1B, by using the deformable casing 110M2 and the electrostatic sensor 120M2.

Having described embodiments in which the metal contact 130, the tactile switch 130M1, and the covering portion 111MB2 are used as a feel generator, the feel generator may have any configuration, other than those of the specific examples described above, that provides a feel similar to at least one of them.

Having described input apparatuses of exemplary embodiments of the present invention, the present invention is not limited to the specifically disclosed embodiments, and various changes and modifications may be made without departing from the scope of the claims.

What is claimed is:

1. An input apparatus comprising:

a base a cover covering the base to define an inner space therebetween, the cover being configured to be subjected to a pressing operation by an operator;

an operation detection sensor configured to output an output value that varies in response to the pressing operation, the operation detection sensor being selected from a group including a capacitance sensor, an optical sensor, and a magnetic sensor;

a processor configured to determine whether the pressing operation has been performed based on the output value; and a feel generator having a deformable contact and a pressing structure that presses and deforms the deformable contact in response to the pressing operation, the feel generator being configured to generate an operation feel to the operator, wherein the processor is further configured to determine that the pressing operation has been completed by:

repeatedly sampling the output value of the operation detection sensor at a predetermined sampling interval;

computing, for each evaluation, a degree of temporal variation of the output value over a predetermined period based on a difference between a current sample and a prior sample taken a predetermined number of samples earlier and a corresponding time difference; and determining that the pressing operation has been completed when the computed degree of temporal variation is within a predetermined range defined by a first threshold and a second threshold for at least a predetermined duration or a predetermined number of consecutive evaluations.

2. The input apparatus according to claim 1, wherein the deformable contact is deformable or displaceable in a pressing direction by the pressing operation, and the feel generator is configured to generate the operation feel to the operator by being deformed under a pressing force of the pressing operation.

3. The input apparatus according to claim 1, wherein the deformable contact includes a domical portion that is inversely deformed under a predetermined pressing force, the output value corresponds to feel characteristics, and the feel characteristics represent characteristics of a pressing force of the pressing operation at an inverting action of the deformable contact.

4. The input apparatus according to claim 3, wherein the feel characteristics have a first pressure deformation period and an inverse period in this order, and in response to the output value corresponding to a slope of the feel characteristics during the inverse period, the processor is configured to determine that the pressing operation has been performed.

5. The input apparatus according to claim 4, wherein the feel characteristics further have a second pressure deformation period after each of the first pressure deformation period and the inverse period, and in response to the output value corresponding to the slope of the feel characteristics during the inverse period, the processor is configured to determine that the pressing operation has been performed.

6. The input apparatus according to claim 4, wherein, in response to the degree of temporal variation in the output value corresponding to a slope of the feel characteristics over the predetermined period, the processor is configured to determine that the pressing operation has been performed.

7. The input apparatus according to claim 6, wherein, in response to the degree of temporal variation in the output value being within a predetermined slope range of the feel characteristics during the predetermined period, the processor is configured to determine that the pressing operation has been performed.

8. The input apparatus according to claim 7, wherein the predetermined period and the predetermined slope range are adjustable.

9. The input apparatus according to claim 1, wherein a capacitance of the capacitance sensor varies according to the pressing operation.

10. An input determination method for an input apparatus, the input apparatus including a base, a cover configured to be subjected to a pressing operation, an operation detection sensor that outputs an output value responsive to the pressing operation, a processor, and a feel generator, the input determination method comprising:

repeatedly sampling the output value at a predetermined sampling interval;

computing, for each evaluation, a degree of temporal variation of the output value over a predetermined period by comparing a current sample with a prior sample taken a predetermined number of samples earlier and a corresponding time difference; and determining that the pressing operation has been completed when the computed degree of temporal variation is within a predetermined range between a first threshold and a second threshold for at least a predetermined duration or a predetermined number of consecutive evaluations.

* * * * *